(12) United States Patent
Zhao

(10) Patent No.: US 11,417,689 B2
(45) Date of Patent: Aug. 16, 2022

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Huihui Zhao, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/972,032

(22) PCT Filed: Aug. 20, 2020

(86) PCT No.: PCT/CN2020/110262
§ 371 (c)(1),
(2) Date: Dec. 4, 2020

(87) PCT Pub. No.: WO2022/011779
PCT Pub. Date: Jan. 20, 2022

(65) Prior Publication Data
US 2022/0020783 A1    Jan. 20, 2022

(30) Foreign Application Priority Data

Jul. 16, 2020   (CN) .......................... 202010684689.X

(51) Int. Cl.
*H01L 27/00* (2006.01)
*H01L 27/12* (2006.01)
*H01L 27/32* (2006.01)

(52) U.S. Cl.
CPC ........ *H01L 27/1251* (2013.01); *H01L 27/124* (2013.01); *H01L 27/1225* (2013.01); *H01L 27/1288* (2013.01); *H01L 27/3262* (2013.01)

(58) Field of Classification Search
CPC ............... H01L 27/1225; H01L 27/124; H01L 27/1251; H01L 27/1288; H01L 27/3262; H01L 27/1248
See application file for complete search history.

(56) References Cited

U.S. PATENT DOCUMENTS 10,263,060 B2 *   4/2019   Noh .................... H01L 27/3258
2016/0240565 A1   8/2016   Kim et al.
(Continued)

FOREIGN PATENT DOCUMENTS

| CN | 105810693 A | 7/2016 |
|---|---|---|
| CN | 106098784 A | 11/2016 |

(Continued)

*Primary Examiner* — Nikolay K Yushin
(74) *Attorney, Agent, or Firm* — The Roy Gross Law Firm, LLC; Roy Gross

(57) ABSTRACT

The present application proposes a display panel, which includes a substrate, and a first thin film transistor and a second thin film transistor disposed on the substrate at intervals, wherein a first metal layer is disposed on a side of the oxide semiconductor layer away from the third gate, a first interlayer insulating layer is disposed between the first metal layer and the oxide semiconductor layer, a second gate insulating layer is disposed on a side of the first metal layer away from the oxide semiconductor layer, and the first metal layer includes a second gate corresponding to the oxide semiconductor layer.

17 Claims, 5 Drawing Sheets

(56) References Cited

U.S. PATENT DOCUMENTS

| | | | |
|---|---|---|---|
| 2018/0033849 A1* | 2/2018 | Noh | .................... H01L 27/1222 |
| 2018/0212062 A1 | 7/2018 | Xie | |
| 2020/0066765 A1 | 2/2020 | Cho et al. | |
| 2020/0350304 A1 | 11/2020 | Lius et al. | |

FOREIGN PATENT DOCUMENTS

| | | | |
|---|---|---|---|
| CN | 106920801 A | 7/2017 |
| CN | 107004682 A | 8/2017 |
| CN | 107331669 A | 11/2017 |
| CN | 108010850 A | 5/2018 |
| KR | 20200023573 A | 3/2020 |

* cited by examiner providing a substrate; — S100 forming a first thin film transistor and a second thin film transistor on the substrate at intervals, wherein the first thin film transistor includes a polysilicon semiconductor layer formed on the substrate, a first gate formed above the polysilicon semiconductor layer, and a first source and a first drain respectively connected to the polysilicon semiconductor layer; the second thin film transistor includes a the oxide semiconductor layer formed on the substrate, a third gate formed above the oxide semiconductor layer, and a second source and a second drain respectively connected to the oxide semiconductor layer; wherein a third gate insulating layer corresponding the third gate is formed between the oxide semiconductor layer and the third gate, and the third gate insulating layer covers part of the oxide semiconductor layer. — S200

FIG. 3

DISPLAY PANEL

BACKGROUND OF INVENTION

Field of Invention

The present invention relates to the field of display technology, and in particular to a display panel.

Description of Prior Art

With development of display technology, low temperature polycrystalline oxide (LTPO), as a low-power display technology, has received more and more attention. Compared with a low temperature poly-silicon thin film transistor (LTPS TFT), the LTPO TFT has a lower driving power, and converts part of the transistor into an oxide, resulting in less leakage current.

At present, compared with the LTPS structure, formation of a LTPO structure requires to be constituted by more layers. First, the LTPS TFT needs to be produced, and then the oxide semiconductor thin film transistor is produced. In order to prevent mutual interference between the oxide semiconductor thin film transistor and the LTPS TFT, a thicker insulating film it is necessary to be formed therebetween to serve as a barrier, thereby increasing a distance between a source/drain of the LTPS TFT and the polysilicon layer, and increasing a length of a via hole between the source/drain and the polysilicon layer. Moreover, with increasing demand for high-resolution displays, the pixel density is increasing, and an aperture of a via hole being required to get smaller and smaller. As a whole, the via hole is deep and has a small aperture, such that an inorganic layer easily remains when etching the via hole, such that a contact resistance between the source/drain and the polysilicon layer is increased, and when the contact resistance is too great, the source/drain traces will be disconnected, resulting in abnormal connection between the source/drain and the polysilicon layer. In addition, because the LTPO structure causes a number of layers to increase, a thickness of the layers in a bonding area of a display panel is increased, which increases difficulty of digging holes in the bonding area, and also impacts performance of pad bending.

Specifically, as shown in FIG. 1, the existing LTPS structure includes film structures such as a substrate 201, a polysilicon layer 202, an first insulating layer 203, a first gate 204, a second insulating layer 205, a third insulating layer 206, and indium gallium zinc oxide (IGZO) layer 207, a fourth insulating layer four 208, a second gate 209, a fifth insulating layer 210, a source/drain 211, and so on, which are sequentially stacked. Obviously, the via hole 212 between the polysilicon layer 202 and the source/drain 211 needs to penetrate many layers including the first insulating layer 203, second insulating layer 205, third insulating layer 206, the fourth insulating layer four 208, and the fifth insulating layer 210, and the aperture is required to be small, such that process difficulty is increased, and the problem of increase in contact resistance or abnormal connection between the source/drain 211 and the polysilicon layer 202. In addition, the second insulating layer 205 is usually made of a material such as SiNx with high hydrogen content and arranged on an entire surface, so that hydrogen ions in the second insulating layer 205 can easily invade the IGZO layer 207 that is extremely sensitive to hydrogen, resulting in failure of the IGZO layer 207 due to its conductorization.

SUMMARY OF INVENTION

The present application provides a display panel to solve the technical problem in the existing LTPO structure that relative many layers are included, resulting in an increase in length of a via hole between a source/drain of the LTPS TFT and a polysilicon layer, reduction in an aperture of the via hole, and increase in process difficulty, such that increase in contact resistance or abnormal connection between the source/drain and the polysilicon layer is easily caused.

To solve the above problem, the technical solutions provided by the present application are as follows:

The present application provides a display panel, including a substrate, and a first thin film transistor and a second thin film transistor arranged on the substrate at intervals, wherein the first thin film transistor includes a polysilicon semiconductor layer disposed on the substrate, a first gate disposed above the polysilicon semiconductor layer, and a first source and a first drain respectively connected to the polysilicon semiconductor layer;

the second thin film transistor includes an oxide semiconductor layer disposed above the substrate, a third gate disposed above the oxide semiconductor layer, and a second source and a second drain respectively connected to the oxide semiconductor layer;

a third gate insulating layer corresponding the third gate is disposed between the oxide semiconductor layer and the third gate, and the third gate insulating layer covers part of the oxide semiconductor layer;

a first metal layer is disposed on a side of the oxide semiconductor layer away from the third gate, a first interlayer insulating layer is disposed between the first metal layer and the oxide semiconductor layer, and a second gate insulating layer is disposed on a side of the first metal layer away from the oxide semiconductor layer, and the first metal layer includes a second gate corresponding to the oxide semiconductor layer; and a first gate insulation layer is disposed on the polysilicon semiconductor layer and the substrate, the first gate is disposed on the first gate insulation layer, and the first metal layer further includes an electrode plate corresponding to the first gate.

In the display panel provided by the present application, the second gate insulating layer is disposed corresponding to the first metal layer, the second gate insulating layer includes a first insulating portion corresponding to the second gate, and an orthographic projection of the first insulating portion on the substrate covers an orthographic projection of the second gate on the substrate.

In the display panel provided by the present application, the second gate insulating layer further includes a second insulating portion corresponding to the electrode plate, the second insulating portion partially covers the polysilicon semiconductor layer, and an orthographic projection of the second insulating portion on the substrate covers an orthographic projection of the electrode plate on the substrate.

In the display panel provided by the present application, a second interlayer insulating layer is disposed on the third gate, and a second metal layer is disposed on the second interlayer insulating layer; and the display panel is provided with a first via hole and a second via hole penetrating the first gate insulating layer, the first interlayer insulating layer, and the second interlayer insulating layer, and provided with a third via hole and a fourth via hole penetrating the second interlayer insulating layer; and the second metal layer is connected to the polysilicon semiconductor layer through the first via hole and the second via hole to form the first source and the first drain, and connected to the oxide semiconductor layer through the third via hole and the fourth via hole to form the second source and the second drain.

In the display panel provided by the present application, the display panel includes a display area and a bonding area adjacent to the display area, and the first thin film transistor and the second thin film transistor are disposed in the display area;

the first metal layer further includes a first metal trace located in the bonding area, the second metal layer further includes a second metal trace located in the bonding area; and a fifth via hole penetrating the first interlayer insulating layer and the second interlayer insulating layer in sequence is defined above the first metal trace, and the second metal trace is connected to the first metal trace through the fifth via hole.

In the display panel provided by the present application, the second gate insulating layer and the first metal layer have a same pattern, and an orthographic projection of the second gate insulating layer on the substrate covering an orthographic projection of the first metal layer on the substrate.

In the display panel provided by the present application, the third gate insulating layer and the third gate have a same pattern, and an orthographic projection of the third gate insulating layer on the substrate cover an orthographic projection of the third gate on the substrate.

In the display panel provided by the present application, the oxide semiconductor layer includes an active segment corresponding to the third gate and two conductor segments respectively located at opposite ends of the active segment, and the orthographic projection of the third gate insulating layer on the substrate covers an orthographic projection of the active segment on the substrate.

In the display panel provided by the present application, the second source and the second drain are respectively connected to the two conductor segments, a wiring resistance of each of the conductor segments is 500 ohms to 1200 ohms, and a contact impedance between the conductor segments and the second source or the second drain is 700 ohms to 1800 ohms.

In the display panel provided by the present application, the third gate insulating layer is located in a channel region between the second source and the second drain from a perspective of a layered-structure).

In the display panel provided by the present application, a width of the third gate insulating layer is greater than a width of the third gate by 0.2 um to 1.2 um.

Beneficial effect of the present application is that in the present application, the third gate insulating layer is disposed corresponding to the third gate, and the third gate insulating layer covers part of the oxide semiconductor layer in the second thin film transistor, so that the third gate insulating layer is prevented from being arranged on an entire surface in the display panel, resulting in reduction in a thickness of layers at other positions in the display panel except an area where the third gate is located, thereby facilitating reduction in a depth of the via hole between the first source/drain and the polysilicon semiconductor layer in the first thin film transistor, and thus the contact resistance of connection between the first source/source and the polysilicon semiconductor layer is reduced. Meanwhile, a thickness of the layers in the bonding area of the display panel is also reduced, thus reducing the difficulty of digging holes in the bonding area, and also reducing impact on pad bending in the bonding area.

BRIEF DESCRIPTION OF DRAWINGS

FIG. 3 is a flow chart of a method of manufacturing a display panel in an embodiment of the present application.

DETAILED DESCRIPTION OF PREFERRED EMBODIMENTS

Figure 1:
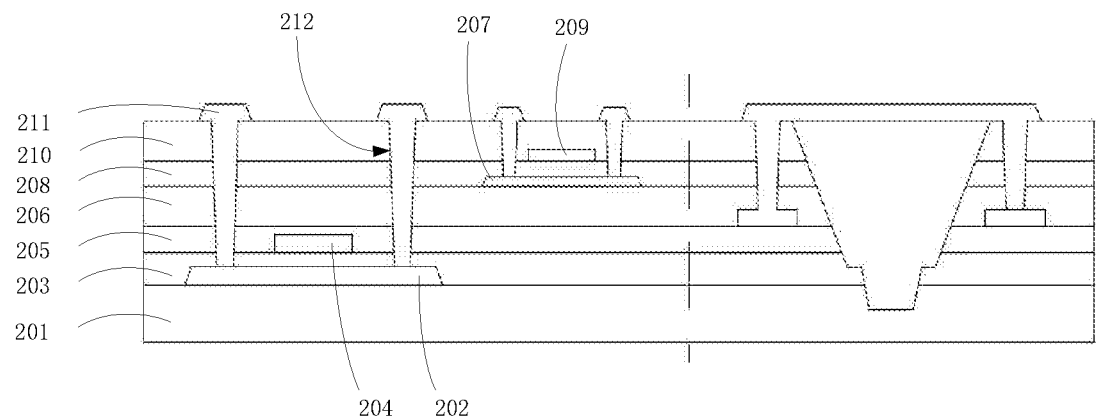
FIG. 1 is a schematic structural diagram of an existing display panel.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

The technical solutions of the present application will now be described in conjunction with specific embodiments.

Figure 2:
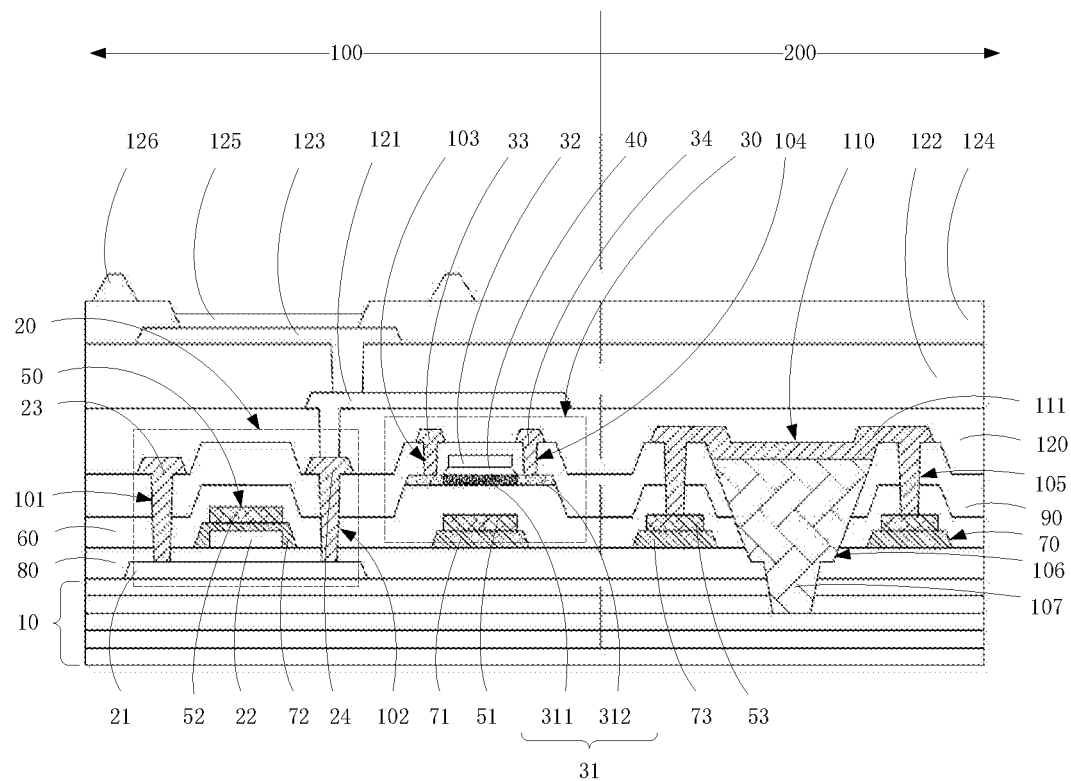
FIG. 2 is a schematic structural diagram of a display panel in an embodiment of the present application.

The present application provides a display panel, as shown in FIG. 2, including a substrate 10, and a first thin film transistor 20 and a second thin film transistor 30 arranged on the substrate 10 at intervals.

The first thin film transistor 20 includes a polysilicon semiconductor layer 21 located on the substrate 10, a first gate 22 located above the polysilicon semiconductor layer 21, and a first source 23 and a first drain 24 respectively connected to the polysilicon semiconductor layer 21.

The second thin film transistor 30 includes an oxide semiconductor layer 31 disposed above the substrate 10, a third gate 32 disposed above the oxide semiconductor layer 31, and a second source 33 and a second drain 34 respectively connected to the oxide semiconductor layer 31.

A third gate insulating layer 40 corresponding the third gate 32 is disposed between the oxide semiconductor layer 31 and the third gate 32, and the third gate insulating layer 40 covers part of the oxide semiconductor layer 31.

A first metal layer 50 is disposed on a side of the oxide semiconductor layer 31 away from the third gate 32, a first interlayer insulating layer 60 is disposed between the first metal layer 50 and the oxide semiconductor layer 31, and a second gate insulating layer 70 is disposed on a side of the first metal layer 50 away from the oxide semiconductor layer 31, and the first metal layer 50 includes a second gate 51 corresponding to the oxide semiconductor layer 31. The second gate insulating layer 70 may be disposed on an entire surface.

A first gate insulating layer 80 is disposed on the polysilicon semiconductor layer 21 and the substrate 10, the first gate 22 is disposed on the first gate insulating layer 80, and the first metal layer 50 further includes an electrode plate 52 corresponding to the first gate 22. The arrangement of the second gate 51 and the electrode plate 52 can significantly improve electrical performance of the first thin film transistor and the second thin film transistor. In addition, the second gate and the electrode plate are located on a same level, and can be manufactured in a same process, which also minimizes the impact on the thickness of the display panel.

It is understandable that at present, compared with the LTPS structure, formation of a LTPO structure requires to be constituted by more layers. First, the LTPS TFT needs to be produced, and then the oxide semiconductor thin film transistor is produced. In order to prevent mutual interference between the oxide semiconductor thin film transistor and the LTPS TFT, a thicker insulating film it is necessary to be formed therebetween to serve as a barrier, thereby increasing a distance between a source/drain of the LTPS TFT and the polysilicon layer, and increasing a length of a via hole between the source/drain and the polysilicon layer. Moreover, with increasing demand for high-resolution displays, the pixel density is increasing, and an aperture of a via hole being required to get smaller and smaller. As a whole, the via hole is deep and has a small aperture, such that an inorganic layer easily remains when etching the via hole, such that a contact resistance between the source/drain and the polysilicon layer is increased, and when the contact resistance is too great, the source/drain traces will be disconnected, resulting in abnormal connection between the source/drain and the polysilicon layer. In addition, because the LTPO structure causes a number of layers to increase, a thickness of the layers in a bonding area of a display panel is increased, which increases difficulty of digging holes in the bonding area, and also impacts performance of pad bending.

In the embodiment, the third gate insulating layer 40 is disposed corresponding to the third gate 32, and the third gate insulating layer 40 covers part of the oxide semiconductor layer 31 in the second thin film transistor 30, so that the third gate insulating layer 40 is prevented from being arranged on an entire surface in the display panel, resulting in reduction in a thickness of layers at other positions in the display panel except an area where the third gate 32 is located, thereby facilitating reduction in a depth of the via hole between the first source 23 and the first drain 24 and the polysilicon semiconductor layer 32 in the first thin film transistor 20, and thus the contact resistance of connection between the first source 23 and the first drain 24 of the polysilicon semiconductor layer 21 is reduced. Meanwhile, a thickness of the layers in the bonding area of the display panel is also reduced, thus reducing the difficulty of digging holes in the bonding area, and also reducing impact on pad bending in the bonding area; wherein, the oxide semiconductor layer 31 is made of a material including indium gallium zinc oxide (IGZO).

In one embodiment, as shown in FIG. 2, the second gate insulating layer 70 is disposed corresponding to the first metal layer 50, and the second gate insulating layer 70 includes the same position as the second gate insulating layer. The first insulating portion 71 disposed corresponding to the pole 51, the orthographic projection of the first insulating portion 71 on the substrate 10 covers the orthographic projection of the second gate 51 on the substrate 10; obviously, this embodiment In an example, the second gate insulating layer 70 is not disposed on the entire surface, but the first insulating portion 71 may be formed by patterning. It is understandable that the second gate insulating layer 70 is disposed corresponding to the first metal layer 50, the thickness of the layer of the display panel outside the area where the first metal layer 50 is located can be reduced. In addition, on the basis of disposing the third gate insulating layer 40 is disposed corresponding to the third gate 32 to reduce the thickness of the layer of the display panel in the bonding area, this embodiment uses the second gate The polar insulating layer 70 is arranged is disposed corresponding to the first metal layer 50, which further reduces the film thickness of the display panel in the bonding area, further reduces the process difficulty of digging in the bonding area, and improves The performance of PAD Bending of each functional layer in the bonding area.

In conclusion, in this embodiment, the second gate insulating layer 70 includes a first insulating portion 71 disposed corresponding to the second gate 51, and the first insulating portion 71 is connected to the second gate 51 corresponds to the position, and the orthographic projection of the first insulating portion 71 on the substrate 10 covers the orthographic projection of the second gate 51 on the substrate 10, so that the first insulating portion 71 The second gate 51 has better support as a whole, and Meanwhile, the film thickness of the portion of the display panel outside the area where the second gate 51 is located is also reduced, for example, the first source is reduced. The number of layers between the electrode 23 and the first drain 24 and the polysilicon semiconductor layer 21, that is, the first source 23, the first drain 24, and the polysilicon semiconductor layer are reduced. Spacing between 21. In addition, as shown in FIG. 1, in the existing LTPO structure, since the insulating layer 205 is usually made of materials such as SiNx with higher hydrogen content and arranged on the entire surface, the hydrogen ions in the insulating layer 205 can easily invade The IGZO layer 207, which is extremely sensitive to hydrogen, causes the IGZO layer 207 to become conductive and fail. In this embodiment, by arranging the first insulating portion 71 and the second gate 51 corresponding to the positions, it is also avoided that the entire surface of the second gate insulating layer 70 is arranged to cause hydrogen ions to invade the The oxide semiconductor layer 31, thereby avoiding the conductorization of the oxide semiconductor layer 31, and the first insulating portion 71 is provided disposed corresponding to the second gate 51, and can also penetrate the second The gate 51 blocks the hydrogen ions in the first insulating portion 71 to prevent the oxide semiconductor layer 31 from being conductive and causing device failure.

In an embodiment, as shown in FIG. 2, the second gate insulating layer 70 further includes a second insulating portion 72 corresponding to the electrode plate 52, the second insulating portion 72 partially covers the polysilicon semiconductor layer 21, and an orthographic projection of the second insulating portion 72 on the substrate 10 covers an orthographic projection of the electrode plate 52 on the substrate 10. It can be understood that the first metal layer 50 may further include an electrode plate 52 disposed corresponding to the first gate 22. Correspondingly, the second gate insulating layer 70 further includes a second insulating portion 72 corresponding to the electrode plate 52. A capacitor is formed between the electrode plate 52 and the first gate 22, and an orthographic projection of the second insulating portion 72 on the substrate 10 covers an orthographic projection of the electrode plate 52 on the substrate 10, such that the second insulating portion 72 can support the electrode plate 52 well. Meanwhile, the second insulating portion 72 can also be used as a dielectric layer between the electrode plate 52 and the first gate 22 forming the capacitor. Obviously, the electrode plate 52 and the second insulating portion 72 located at the area between the first source 23 and the first drain 24 does not impact the film thickness between the first source 23 and the first drain 24 and the polysilicon semiconductor layer 21.

In one embodiment, as shown in FIG. 2, a second interlayer insulating layer 90 is disposed on the third gate 32, and a second metal layer 110 is disposed on the second interlayer insulating layer 90.

The display panel is provided with a first via hole 101 and a second via hole 102 penetrating the first gate insulating layer 80, the first interlayer insulating layer 60, and the second interlayer insulating layer 90, and provided with a third via hole 103 and a fourth via hole 104 penetrating the second interlayer insulating layer 90. The second metal layer 110 is connected to the polysilicon semiconductor layer 21 through the first via hole 101 and the second via hole 102 to form the first source 23 and the first drain 24, and connected to the oxide semiconductor layer 31 through the third via hole 103 and the fourth via hole 104 to form the second source 33 and the second drain 34. It can be understood that the first via hole 101 and the second via hole 102 only need to penetrate three functional layers including the first gate insulating layer 80, the first interlayer insulating layer 60, and the second interlayer insulating layer 90, without penetrating the third gate insulating layer 40 and the second gate insulating layer 70, which greatly reduces the depths of the first via hole 101 and the second via hole, thereby reducing difficulty of manufacturing the first via hole 101 and the second via hole 102. Meanwhile, a contact resistance between the first source 23 and the first drain 24 and the polysilicon semiconductor layer 21 is also reduced, such that, the problem of abnormal connection between the first source 23 and the first drain 24 and the polysilicon semiconductor layer 21 is avoided. Specifically, a diameter of each of the first via hole 101 and the second via hole 102 is reduced from a range of 1.1 µm to 1.6 µm to a range of 0.7 µm to 1.4 µm. Similarly, the third via hole 103 and the fourth via hole 104 only need to penetrate the second interlayer insulating layer 90, without additionally penetrating the third gate insulating layer 40, which also reduces difficulty of manufacturing the third via hole 103 and the fourth via hole, and reduces a contact resistance between the second source 33 and the second drain 34 and the oxide semiconductor layer 31.

In one embodiment, as shown in FIG. 2, the display panel includes a display area 100 and a bonding area 200 adjacent to the display area 100, and the first thin film transistor 20 and the second thin film transistor 30 are disposed in the display area 100;

The first metal layer 50 further includes a first metal trace 53 located in the bonding area 200, and the second metal layer 110 further includes a second metal trace 111 located in the bonding area 200. A fifth via hole 105 penetrating the first interlayer insulating layer 60 and the second interlayer insulating layer 60 in sequence is defined above the first metal trace 53, and the second metal trace 111 is connected to the first metal trace 53 through the fifth via hole 105. It can be understood that the fifth via hole 105 only needs to penetrate the first interlayer insulating layer 60 and the second interlayer insulating layer 90 without penetrating the second gate insulating layer 70, thereby also reducing the process of manufacturing the fifth via hole 105, and reducing a contact resistance between the second metal trace 111 and the first metal trace 53.

It is worth noting that, as shown in FIG. 2, in this embodiment, when the first metal layer 50 further includes the first metal trace 53 located in the bonding region 200, the second gate further includes a third insulating portion 73 corresponding to the first metal trace 53. An orthographic projection of the third insulating portion 73 on the substrate 10 covers an orthographic projection of the first metal trace 53 on the substrate 10. Obviously, the first metal trace 53 and the third insulating portion 73 are located in the bonding area 200, such that a number of layers penetrated by the first via hole 101 and the second via hole 102 is not additionally increased. In addition, as shown in FIG. 2, the display panel further includes a deep hole 106 located in the bonding area 200, the deep hole is filled with an organic filling layer 107, and the substrate 10 includes a first substrate 11, a spacer layer 12, a second substrate 13, a buffer layer 14, and a covering layer 15 stacked sequentially. Specifically, the deep hole 106 only needs to penetrate the buffer layer 14, the covering layer 15, the first gate insulating layer 80, the first interlayer insulating layer 60, and the second interlayer insulating layer 90 without penetrating the second gate insulating layer 70 and the third gate insulating layer 40, thereby reducing difficulty of manufacturing the deep hole 106, and improving performance of pad bending of each functional layer in the bonding area 200.

In one embodiment, as shown in FIG. 2, the second gate insulating layer 70 has the same pattern as the first metal layer 50, and an orthographic projection of the second gate insulating layer 70 on the substrate 10 covers an orthographic projection of the first metal layer 50 on the substrate 10. It can be understood that the second gate insulating layer 70 has the same pattern as the first metal layer 50, so that the second gate insulating layer 70 is exactly aligned with the first metal layer 50. In this embodiment, the second gate insulating layer 70 and the first metal layer 50 can be patterned by using the same photomask, so that the orthographic projection of the second gate insulating layer 70 on the substrate 10 covers the orthographic projection of the first metal layer 50 on the substrate 10, which prevents the second gate insulating layer 70 from being disposed in an area outside the position of the first metal layer 50, and reduces the film thickness of an area outside the position of the metal layer 50.

In one embodiment, as shown in FIG. 2, the third gate insulating layer 40 and the third gate 32 have the same pattern, and an orthographic projection of the third gate insulating layer 40 on the substrate 10 covers an orthographic projection of the third gate 32 on the substrate 10. It can be understood that the third gate insulating layer 40 and the third gate 32 have the same pattern, so that the third gate insulating layer 40 is exactly aligned with the third gate 32. In this embodiment, the third gate insulating layer 40 and the third gate 32 can be patterned by using the same photomask, so that the orthographic projection of the third gate insulating layer 40 on the substrate 10 covers the orthographic projection of the third gate 32 on the substrate 10, such that the third gate insulating layer 40 is prevented from being disposed at the area outside the position of the third gate 32, and thus the film thickness of the position of the third gate 32 is reduced.

In one embodiment, as shown in FIG. 2, the oxide semiconductor layer 31 includes an active segment 311 disposed corresponding to the third gate 32 and two conductor segments 312 respectively located at opposite ends of the active segment 311, and the orthographic projection of the third gate insulating layer 40 on the substrate 10 covers the orthographic projection of the active segment 311 on the substrate 10. It can be understood that the third gate insulating layer layer 40 covers part of the oxide semiconductor layer 31. In this embodiment, the orthographic projection of the third gate insulating layer 40 on the substrate 10 covers the orthographic projection of the active segment 311 on the substrate 10, so that the active segment 311 is disposed corresponding to the third gate insulating layer 40. By such an arrangement, in a specific manufacturing process, after the third gate insulating layer 40 and the third gate 32 are formed on the oxide semiconductor layer 31, the oxide semiconductor layer 31 can be directly conductorized, wherein the portion of the oxide semiconductor layer 31 that is not covered by the third gate insulating layer 40 is directly conductorized using the third gate insulating layer 40 as a mask, so that the oxide semiconductor layer 31 includes the active segment 311 disposed corresponding to the third gate 32 and the two active conductor segments 132 located at opposite ends of the active segment 311, respectively. Conductor segment 312. Compared with the existing IGZO structure, wherein an entire surface of the oxide semiconductor in the IGZO TFT is covered, the oxide semiconductor layer 31 can only be conductorized after the first via hole 101 and the second via hole 102 are formed, and only partial regions of the oxide semiconductor layer 31 corresponding to the first via hole 101 and the second via hole 102 can be conductorized; in this embodiment, the other parts of the oxide semiconductor layer 31 except for the active segment 311 are completely conductorized, which reduces a wiring resistance of the conductor segments 312, and also reduces the contact resistance between the conductor segment 312 and the second source 33 or the second drain 34. Specifically, the second source 33 and the second drain 34 are respectively connected to the two conductor segments 312, a wiring resistance of each of the conductor segments 312 is 500 ohms to 1200 ohms, and a contact impedance between the conductor segments 312 and the second source 33 or the second drain 34 is 700 ohms to 1800 ohms. In addition, in specific use, the oxide semiconductor layer 31 may also include other oxide semiconductor traces (not shown) connected to functional layers if necessary, and using the above-mentioned structure in this embodiment, conductorization of the oxide semiconductor traces can also be achieved completely, thereby reducing the contact resistance of the connection between the oxide semiconductor layer 31 and other functional layers.

In one embodiment, as shown in FIG. 2, the third gate insulating layer 40 is located in a channel region between the second source 33 and the second drain 34 from a perspective of a layered-structure. It is understandable that the third gate insulating layer 40 may be located in the channel region between the second source 33 and the second drain 34, that is, the third gate insulating layer 40 is prevented from being located under the second source 33 and the second drain 34, thereby reducing the hole depths of the third via hole 103 and the fourth via hole 104 under the second source 33 and the second drain 34.

In an embodiment, a width of the third gate insulating layer 40 is greater than a width of the third gate 32 by 0.2 um to 1.2 um. It can be understood that the width of the third gate insulating layer 40 is set to be greater than the width of the third gate 32 to prevent short-circuit phenomenon from easily occurring between the third gate 32 and the oxide semiconductor layer 31 due to the width of the third gate 32 greater than that of the third gate insulating layer 40. In this embodiment, the third gate insulating layer 40 and the third gate 32 can be patterned by using the same photomask, so that the orthographic projection of the third gate insulating layer 40 on the substrate 10 covers the orthographic projection of the third gate 32 on the substrate 10. An inclination angle between the third gate insulating layer 40 and a side of the third gate 32 can be adjusted by a patterning process. Specifically, the width of the third gate insulating layer 40 is 0.2 um to 1.2 um larger than the width of the third gate 32; and at the same side, the width of one side of the third gate insulating layer 40 is 0.1 um to 0.6 um larger than the width of one side of the third gate 32. In addition, the display panel may further include a first planarization layer 120, a bridge layer 121, a second planarization layer 122, an anode 123, a pixel definition layer 124, a light-emitting function layer 125, and a supporting spacer 126, which are disposed above the second interlayer insulating layer 90.

The present application also provides a method of manufacturing a display panel, as shown in FIG. 3, including the following steps:

Step S100: providing a substrate 10;

Step S200: forming a first thin film transistor 20 and a second thin film transistor 30 on the substrate 10 at intervals, wherein the first thin film transistor 20 includes a polysilicon semiconductor layer 21 formed on the substrate 10, a first gate 22 formed above the polysilicon semiconductor layer 21, and a first source 23 and a first drain 24 respectively connected to the polysilicon semiconductor layer 21; the second thin film transistor 30 includes a the oxide semiconductor layer 31 formed on the substrate 10, a third gate 32 formed above the oxide semiconductor layer 31, and a second source 33 and a second drain 34 respectively connected to the oxide semiconductor layer 31; wherein a third gate insulating layer 40 corresponding the third gate 32 is formed between the oxide semiconductor layer 31 and the third gate 32, and the third gate insulating layer 40 covers part of the oxide semiconductor layer 31.

Figure 4A:
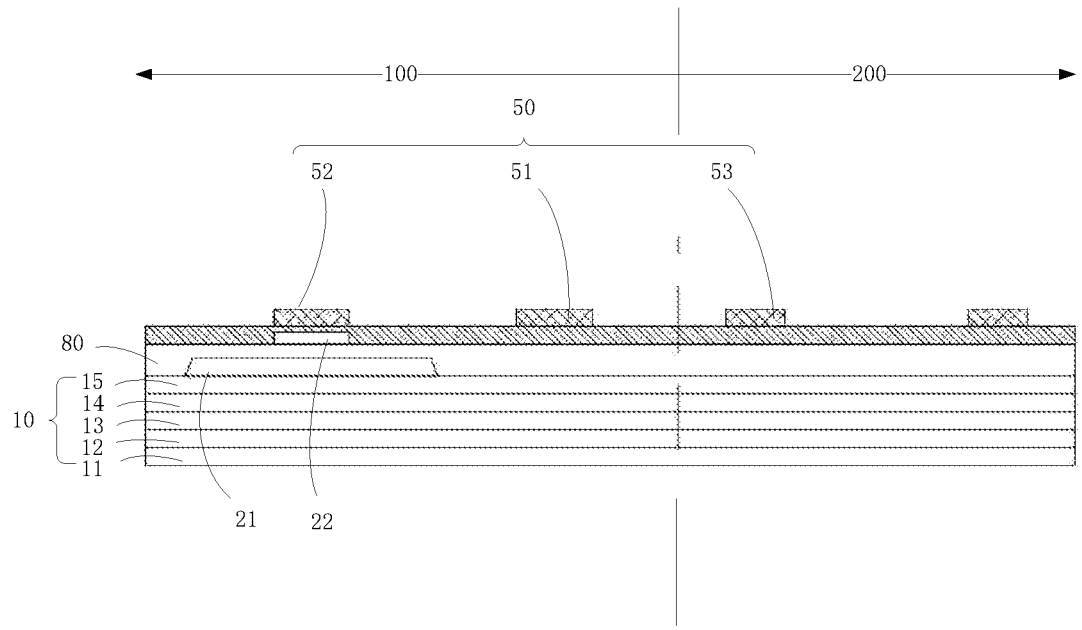
FIGS. 4A-4F are a flow chart showing structures in processes of a method of manufacturing a display panel in the embodiment of the present application.
Figure 4B:
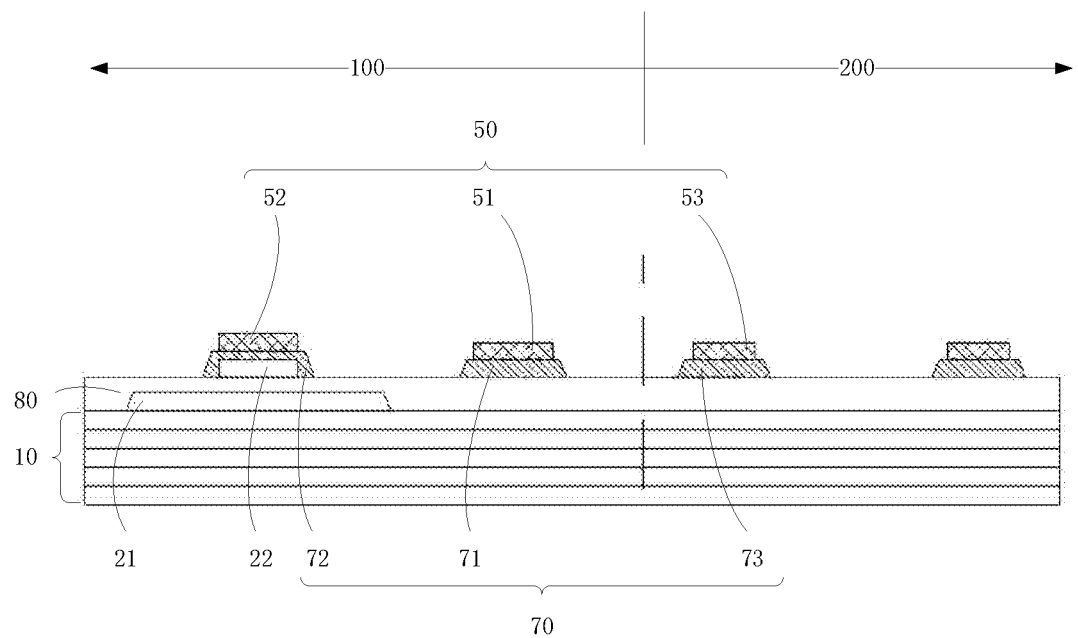
Figure 4C:
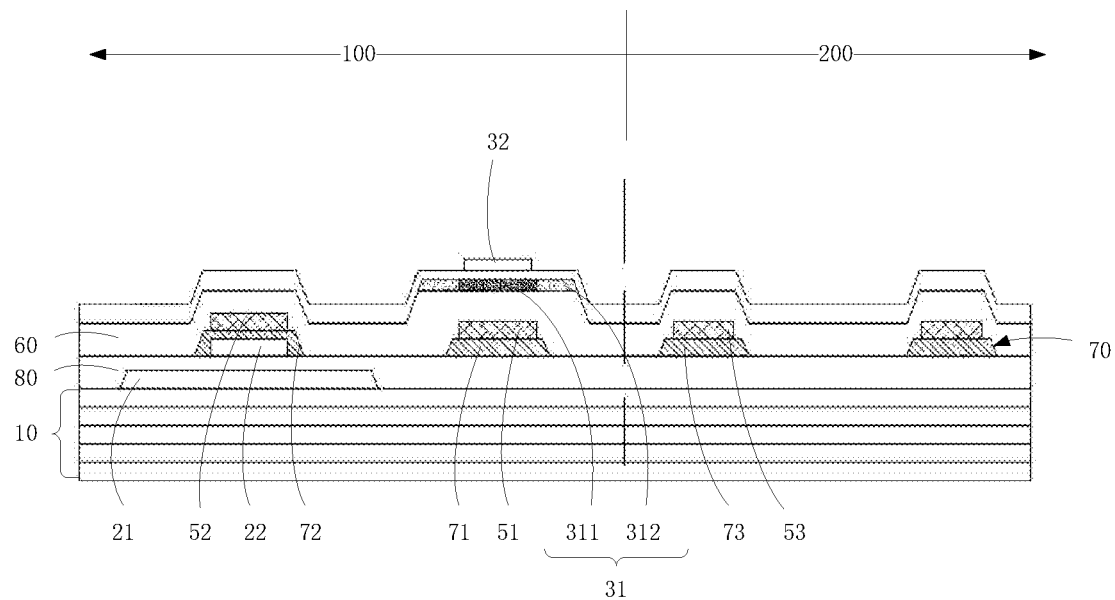
Figure 4D:
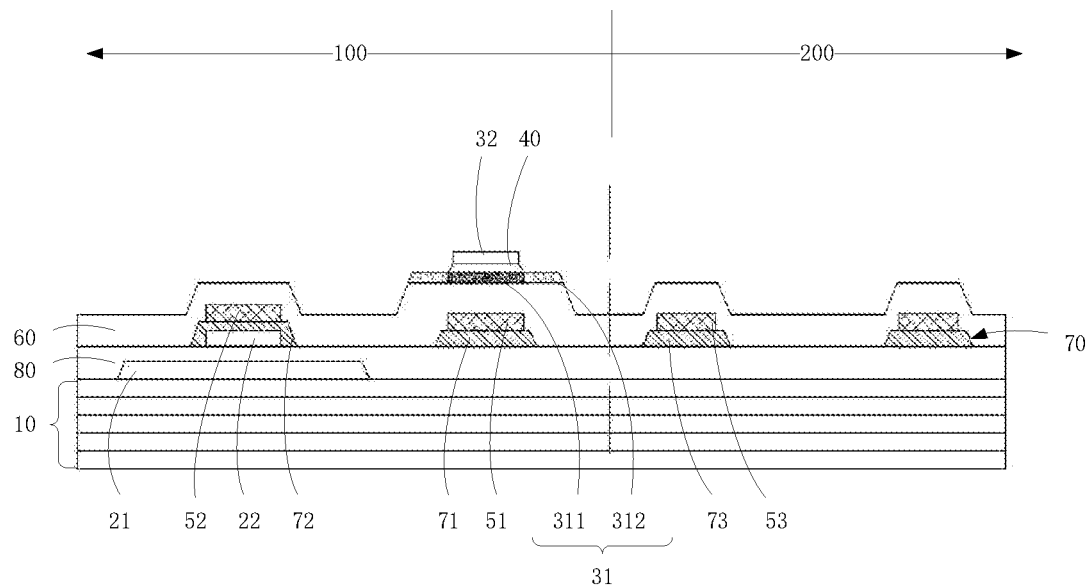

It can be understood that, in the process of manufacturing the second thin film transistor 30, by forming the third gate insulating layer 40 corresponding to the third gate 32, it is equivalent to patterning the third gate insulating layer 40, to prevent the third gate insulating layer 40 from being covering an entire surface which increases the thickness of each region of the display panel. Specifically, as shown in FIG. 4C to FIG. 4D, the third gate insulating layer 40 and the third gate 32 are patterned by using the same photomask. It should be noted that the third gate insulating layer 40 and the third gate 32 are patterned by using the same photomask, and the third gate insulating layer 40 and the third gate 32 may also be etched and molded using the same photomask, which can also be understood as the third gate insulating layer 40 is etched and molded by using the etched and molded third gate 32 as a photomask, so that the third gate insulating layer 40 and the third gate 32 have the same pattern, and the orthographic projection of the third gate insulating layer 40 on the substrate 10 covers the orthographic projection of the third gate 32 on the substrate 10. The only difference on etching between the third gate insulating layer 40 and the third gate 32 is that in the patterning process, etching gases used to etch the third gate insulating layer 40 and the third gate 32 are different, which not only changes the pattern of the third gate insulating layer 40, but also reduces the depth of the via hole 113 between the first source 23 and the first drain 24 and the polysilicon semiconductor layer 21 in the first thin film transistor 20, such that the contact resistance of connection between the first source 23 and the first drain 24 and the polysilicon semiconductor layer is reduced, and there is no additional process and production cost, thus being suitable for large-scale production.

In one embodiment, as shown in FIG. 4A to FIG. 4E, in step S200, the first thin film transistor 20 and the second thin film transistor 30 are arranged at intervals on the substrate 10, and the method includes:

forming a first gate insulating layer 80 on the polysilicon semiconductor layer 21 and the substrate 10, forming a first gate 22 on the first gate insulating layer 80, forming a second gate insulating layer 70 on the first gate 22, forming a first metal layer 50 on the second gate insulating layer 70, forming a first metal layer 50 on the first metal layer 50, and forming a first interlayer insulating layer 60 on the first metal layer 50 and the first gate insulating layer 80, wherein the second gate insulating layer 70 is disposed corresponding to the first metal layer 50, the first metal layer 50 includes a first second gate 51 disposed corresponding to the oxide semiconductor layer 31, the second gate insulating layer 70 includes a first insulating portion 71 disposed corresponding to the second gate 51, and the orthographic projection of the first insulating portion 71 on the substrate 10 covers the orthographic projection of the second gate 51 on the substrate 10;

forming the oxide semiconductor layer 31 on the first interlayer insulating layer 60, forming a second interlayer insulating layer 90 on the third gate 32, and forming a second metal layer 110 on the second interlayer insulating layer 90.

It can be understood that, the second gate insulating layer 70 is formed corresponding to the first metal layer 50, it is equivalent to patterning the second gate insulating layer 70, to prevent the second gate insulating layer 70 from being covering an entire surface which increases the thickness of each region of the display panel. In one embodiment, as shown in FIG. 4A to FIG. 4B, the second gate insulating layer 70 and the first metal layer 50 are patterned by using the same mask. It should be noted that the second gate insulating layer 70 and the first metal layer 50 are patterned by using the same photomask, and the second gate insulating layer 70 and the first metal layer 50 may also be etched and molded using the same photomask, which can also be understood as the second gate insulating layer 70 is etched and molded by using the etched and molded first metal layer 50 as a photomask, so that the second gate insulating layer 70 and the first metal layer 50 have the same pattern, and the orthographic projection of the second gate insulating layer 70 on the substrate 10 covers the orthographic projection of the first metal layer 50 on the substrate 10. The only difference on etching between the second gate insulating layer 70 and the first metal layer 50 is that in the patterning process, etching gases used to etch the second gate insulating layer 70 and the first metal layer 50 are different, which not only changes the pattern of the second gate insulating layer 70, but also reduces the depth of the via hole 113 between the first source 23 and the first drain 24 and the polysilicon semiconductor layer 21 in the first thin film transistor 20, such that the contact resistance of connection between the first source 23 and the first drain 24 and the polysilicon semiconductor layer is reduced, and there is no additional process and production cost, thus being suitable for large-scale production. Specifically, the first metal layer 50 includes a second gate 51 corresponding to the oxide semiconductor layer 31, and the second gate insulating layer 70 includes a first insulating portion 71 corresponding to the second gate 51, wherein the orthographic projection of the first insulating portion 71 on the substrate 10 covers the orthographic projection of the second gate 51 on the substrate 10.

In an embodiment, before forming the second metal layer 110 on the second interlayer insulating layer 90, the method further includes:

forming a first via hole 101 and a second via hole 102 penetrating the first gate insulating layer 80, the first interlayer insulating layer 60, and the second interlayer insulating layer 90 in the display panel, and forming a third via hole 103 and a fourth via hole 104 penetrating the second interlayer insulating layer 90.

The step of forming the second metal layer 110 on the second interlayer insulating layer 90 includes:

forming a first source 23 and a first drain 24 connected to the polysilicon semiconductor layer 21 through the first via hole 101 and the second via hole 102 on the second interlayer insulating layer 90; and forming a second source 33 and a second drain 34 connected to the oxide semiconductor layer 31 through the third via hole 103 and the fourth via hole 104.

Figure 4E:
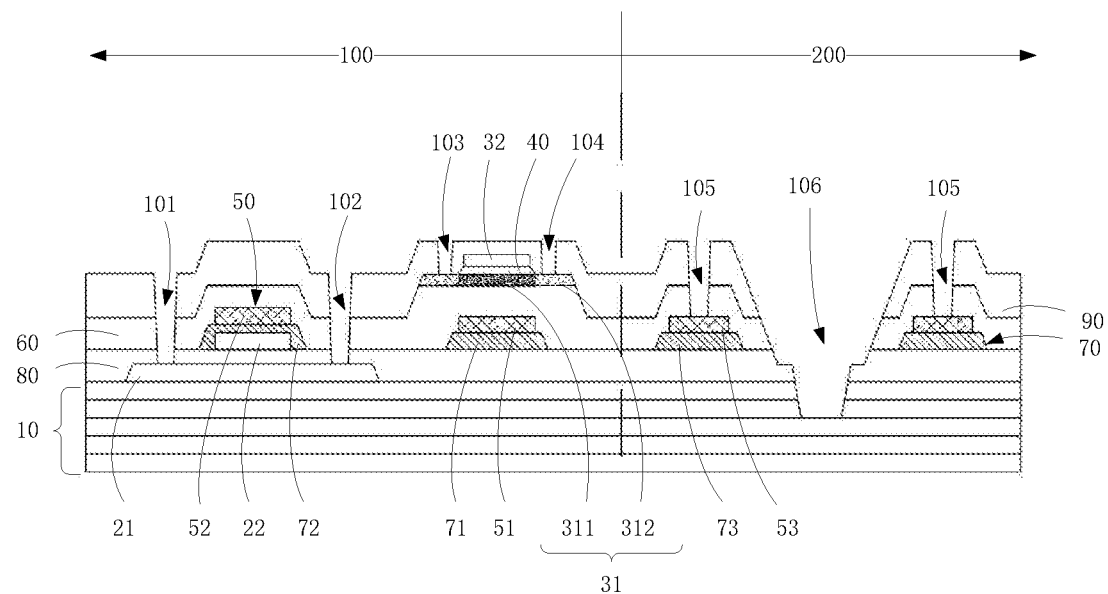
Figure 4F:
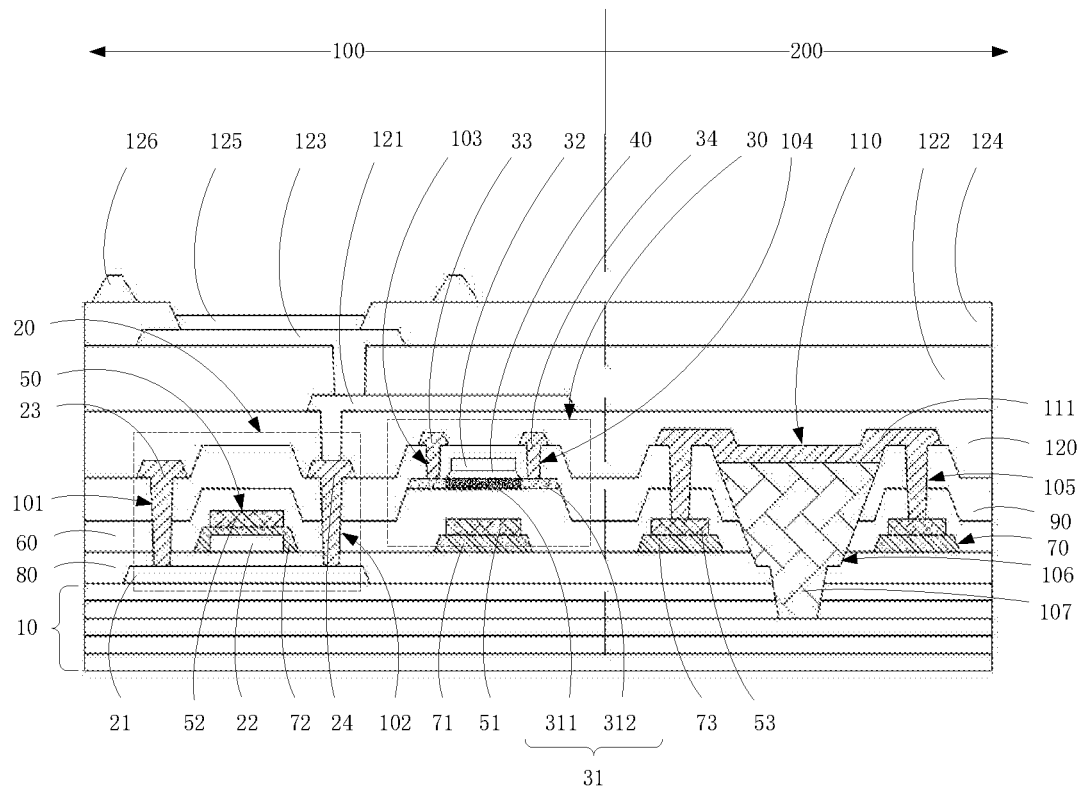

It is understandable that, as shown in FIG. 4E to FIG. 4F, the display panel includes a display area 100 and a bonding area 200 adjacent to the display area 100, the first thin film transistor 20 and the second thin film transistor 30 are disposed in the display area 100, and the substrate 10 includes a first substrate 11, a spacer layer 12, a second substrate 13, a buffer layer 14, and a covering layer 15 stacked sequentially; wherein, a first via hole 101, a second via hole 102, a third via hole 103, and a fourth via hole 104 are formed in the display panel, while a fifth via hole 105 and a deep via hole 105 are formed in the bonding area 200 of the display panel. The fifth via hole 105 penetrates the first interlayer insulating layer 60 and the second interlayer insulating layer 90, and the deep hole 106 penetrates the buffer layer 14, the cover layer 15, the first gate insulating layer 80, the first interlayer insulating layer 60, and the second interlayer insulating layer 90. Obviously, the fifth via hole 105 does not need to penetrate the second gate insulating layer 70, and the deep hole 106 does not need to penetrate the second gate insulating layer 70 and the third gate insulating layer 40, such that the process of manufacturing the fifth via hole 105 and the deep hole 106 is reduced, the contact resistance between the second metal trace 111 and the first metal trace 53 is reduced, and performance of pad bending of each functional layer in the bonding area 200 is improved.

In addition, as shown in FIG. 4F, the method of manufacturing the display panel further includes sequentially forming a first planarization layer 120, a bridge layer 121, a second planarization layer 122, an anode 123, a pixel definition layer 124, a light-emitting function layer 125, and a supporting spacer 126 on the second interlayer insulating layer 90.

In summary, in the present application, the third gate insulating layer 40 is disposed corresponding to the third gate 32, and the third gate insulating layer 40 covers part of the oxide semiconductor layer 31 in the second thin film transistor 30, so that the third gate insulating layer 40 is prevented from being arranged on an entire surface in the display panel, resulting in reduction in a thickness of layers at other positions in the display panel except an area where the third gate 32 is located, thereby facilitating reduction in a depth of the via hole between the first source 23 and the first drain 24 and the polysilicon semiconductor layer 21 in the first thin film transistor 20, and thus the contact resistance of connection between the first source 23 and the first drain 24 and the polysilicon semiconductor layer is reduced. Meanwhile, a thickness of the layers in the bonding area 200 of the display panel is also reduced, thus reducing the difficulty of digging holes in the bonding area 200, and also reducing impact on pad bending in the bonding area 200.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a substrate, and a first thin film transistor and a second thin film transistor arranged on the substrate at intervals,
    wherein the first thin film transistor comprises a polysilicon semiconductor layer disposed on the substrate, a first gate disposed above the polysilicon semiconductor layer, and a first source and a first drain respectively connected to the polysilicon semiconductor layer;
    the second thin film transistor comprises an oxide semiconductor layer disposed above the substrate, a third gate disposed above the oxide semiconductor layer, and a second source and a second drain respectively connected to the oxide semiconductor layer;
    a third gate insulating layer corresponding the third gate is disposed between the oxide semiconductor layer and the third gate, and the third gate insulating layer covers part of the oxide semiconductor layer;
    a first metal layer is disposed on a side of the oxide semiconductor layer away from the third gate, a first interlayer insulating layer is disposed between the first metal layer and the oxide semiconductor layer, a second gate insulating layer is disposed on a side of the first metal layer away from the oxide semiconductor layer, and the first metal layer comprises a second gate corresponding to the oxide semiconductor layer;
    a first gate insulation layer is disposed on the polysilicon semiconductor layer and the substrate, the first gate is disposed on the first gate insulation layer, and the first metal layer further comprises an electrode plate corresponding to the first gate;
    a second gate insulating layer is disposed corresponding to the first metal layer, the second gate insulating layer comprises a first insulating portion corresponding to the second gate, and an orthographic projection of the first insulating portion on the substrate covers an orthographic projection of the second gate on the substrate; and
    the second gate insulating layer further comprises a second insulating portion corresponding to the electrode plate, the second insulating portion partially covers the polysilicon semiconductor layer, and an orthographic projection of the second insulating portion on the substrate covers an orthographic projection of the electrode plate on the substrate.

2. The display panel according to claim 1, wherein the second gate insulating layer and the first metal layer have a same pattern, and an orthographic projection of the second gate insulating layer on the substrate covering an orthographic projection of the first metal layer on the substrate.

3. The display panel according to claim 1, wherein a second interlayer insulating layer is disposed on the third gate, and a second metal layer is disposed on the second interlayer insulating layer; and
    the display panel is provided with a first via hole and a second via hole penetrating the first gate insulating layer, the first interlayer insulating layer, and the second interlayer insulating layer, and provided with a third via hole and a fourth via hole penetrating the second interlayer insulating layer; and
    the second metal layer is connected to the polysilicon semiconductor layer through the first via hole and the second via hole to form the first source and the first drain, and connected to the oxide semiconductor layer through the third via hole and the fourth via hole to form the second source and the second drain.

4. The display panel according to claim 3, wherein the display panel comprises a display area and a bonding area adjacent to the display area, and the first thin film transistor and the second thin film transistor are disposed in the display area;
    the first metal layer further comprises a first metal trace located in the bonding area, the second metal layer further comprises a second metal trace located in the bonding area; and
    a fifth via hole penetrating the first interlayer insulating layer and the second interlayer insulating layer in sequence is defined above the first metal trace, and the second metal trace is connected to the first metal trace through the fifth via hole.

5. The display panel according to claim 1, wherein the third gate insulating layer and the third gate have a same pattern, and an orthographic projection of the third gate insulating layer on the substrate cover an orthographic projection of the third gate on the substrate.

6. The display panel according to claim 5, wherein the third gate insulating layer is located in a channel region between the second source and the second drain from a perspective of a layered-structure.

7. The display panel according to claim 5, wherein a width of the third gate insulating layer is greater than a width of the third gate by 0.2 um to 1.2 um.

8. The display panel according to claim 5, wherein the oxide semiconductor layer comprises an active segment corresponding to the third gate and two conductor segments respectively located at opposite ends of the active segment, and the orthographic projection of the third gate insulating layer on the substrate covers an orthographic projection of the active segment on the substrate.

9. The display panel according to claim 8, wherein the second source and the second drain are respectively connected to the two conductor segments, a wiring resistance of each of the conductor segments is 500 ohms to 1200 ohms, and a contact impedance between the conductor segments and the second source or the second drain is 700 ohms to 1800 ohms.

10. A display panel, comprising a substrate, and a first thin film transistor and a second thin film transistor arranged on the substrate at intervals;
wherein the first thin film transistor comprises a polysilicon semiconductor layer disposed on the substrate, a first gate disposed above the polysilicon semiconductor layer, and a first source and a first drain respectively connected to the polysilicon semiconductor layer;
the second thin film transistor comprises an oxide semiconductor layer disposed above the substrate, a third gate disposed above the oxide semiconductor layer, and a second source and a second drain respectively connected to the oxide semiconductor layer;
a third gate insulating layer corresponding the third gate is disposed between the oxide semiconductor layer and the third gate, and the third gate insulating layer covers part of the oxide semiconductor layer;
a first metal layer is disposed on a side of the oxide semiconductor layer away from the third gate, a first interlayer insulating layer is disposed between the first metal layer and the oxide semiconductor layer, a second gate insulating layer is disposed on a side of the first metal layer away from the oxide semiconductor layer, and the first metal layer comprises a second gate corresponding to the oxide semiconductor layer;
a first gate insulation layer is disposed on the polysilicon semiconductor layer and the substrate, the first gate is disposed on the first gate insulation layer, and the first metal layer further comprises an electrode plate corresponding to the first gate;
the second gate insulating layer is disposed corresponding to the first metal layer, the second gate insulating layer comprises a first insulating portion corresponding to the second gate, and an orthographic projection of the first insulating portion on the substrate covers an orthographic projection of the second gate on the substrate;
the third gate insulating layer and the third gate have the same pattern, and an orthographic projection of the third gate insulating layer on the substrate covers the orthographic projection of the third gate on the substrate; and
the second gate insulating layer further comprises a second insulating portion corresponding to the electrode plate, the second insulating portion partially covers the polysilicon semiconductor layer, and an orthographic projection of the second insulating portion on the substrate covers an orthographic projection of the electrode plate on the substrate.

11. The display panel according to claim 10,
the second gate insulating layer and the first metal layer have a same pattern, and an orthographic projection of the second gate insulating layer on the substrate covering an orthographic projection of the first metal layer on the substrate.

12. The display panel according to claim 10, wherein the third gate insulating layer is located in a channel region between the second source and the second drain from a perspective of a layered-structure.

13. The display panel according to claim 10, wherein a width of the third gate insulating layer is greater than a width of the third gate by 0.2 um to 1.2 um.

14. The display panel according to claim 10, wherein a second interlayer insulating layer is disposed on the third gate, and a second metal layer is disposed on the second interlayer insulating layer; and
the display panel is provided with a first via hole and a second via hole penetrating the first gate insulating layer, the first interlayer insulating layer, and the second interlayer insulating layer, and provided with a third via hole and a fourth via hole penetrating the second interlayer insulating layer; and
the second metal layer is connected to the polysilicon semiconductor layer through the first via hole and the second via hole to form the first source and the first drain, and connected to the oxide semiconductor layer through the third via hole and the fourth via hole to form the second source and the second drain.

15. The display panel according to claim 14, wherein the display panel comprises a display area and a bonding area adjacent to the display area, and the first thin film transistor and the second thin film transistor are disposed in the display area;
the first metal layer further comprises a first metal trace located in the bonding area, the second metal layer further comprises a second metal trace located in the bonding area; and
a fifth via hole penetrates the first interlayer insulating layer and the second interlayer insulating layer in sequence is defined above the first metal trace, and the second metal trace is connected to the first metal trace through the fifth via hole.

16. The display panel according to claim 10, wherein the third gate insulating layer and the third gate have a same pattern, and an orthographic projection of the third gate insulating layer on the substrate cover an orthographic projection of the third gate on the substrate.

17. The display panel according to claim 16, wherein the second source and the second drain are respectively connected to the two conductor segments, a wiring resistance of each of the conductor segments is 500 ohms to 1200 ohms, and a contact impedance between the conductor segments and the second source or the second drain is 700 ohms to 1800 ohms.

* * * * *